United States Patent
Grumbine et al.

(10) Patent No.: US 6,646,348 B1
(45) Date of Patent: Nov. 11, 2003

(54) SILANE CONTAINING POLISHING COMPOSITION FOR CMP

(75) Inventors: Steven K. Grumbine, Aurora, IL (US); Shumin Wang, Naperville, IL (US)

(73) Assignee: Cabot Microelectronics Corporation, Aurora, IL (US)

( * ) Notice: Subject to any disclaimer, the term of this patent is extended or adjusted under 35 U.S.C. 154(b) by 94 days.

(21) Appl. No.: 09/609,480

(22) Filed: Jul. 5, 2000

(51) Int. Cl.[7] ............................................ H01L 23/48
(52) U.S. Cl. ....................................... 257/752; 438/747
(58) Field of Search .............................. 438/692, 693, 438/745, 749, 959, 752, 747

(56) References Cited

U.S. PATENT DOCUMENTS

| | | | |
|---|---|---|---|
| 4,563,483 A | 1/1986 | Smith et al. ................. 521/111 |
| 5,246,972 A | * 9/1993 | Cifuentes et al. ............. 521/54 |
| 5,516,346 A | 5/1996 | Cadien et al. ................. 51/308 |
| 5,527,423 A | 6/1996 | Neville et al. ............ 156/636.1 |
| 5,645,736 A | 7/1997 | Allman ......................... 216/89 |
| 5,693,239 A | 12/1997 | Wang ........................... 216/88 |
| 5,728,308 A | 3/1998 | Muroyama |
| 5,767,016 A | * 6/1998 | Muroyama .................. 438/693 |
| 5,770,103 A | 6/1998 | Wang et al. ................ 252/79.1 |
| 5,827,781 A | 10/1998 | Skrovan et al. .............. 438/692 |
| 5,858,813 A | 1/1999 | Scherber et al. ............. 438/693 |
| 5,861,055 A | 1/1999 | Allman et al. .................. 106/3 |
| 5,863,307 A | 1/1999 | Zhou et al. .................... 51/307 |
| 5,876,490 A | 3/1999 | Ronay ............................ 106/3 |
| 5,885,334 A | 3/1999 | Suzuki et al. ................... 106/3 |
| 5,891,205 A | 4/1999 | Picardi et al. ................ 51/308 |
| 5,899,745 A | 5/1999 | Kim et al. .................... 438/692 |
| 5,922,620 A | 7/1999 | Shimomura et al. ........ 438/693 |
| 5,934,980 A | 8/1999 | Koos et al. .................... 451/41 |
| 5,954,869 A | * 9/1999 | Elfersy et al. ......... 106/287.16 |
| 5,968,843 A | 10/1999 | Dawson et al. ............. 438/693 |
| 5,972,792 A | 10/1999 | Hudson ....................... 438/691 |
| 5,980,775 A | 11/1999 | Grumbine et al. ......... 252/79.1 |
| 6,136,711 A | 10/2000 | Grumbine et al. .......... 438/692 |
| 6,197,105 B1 | * 3/2001 | Freeman et al. ............ 106/487 |
| 6,299,659 B1 | * 10/2001 | Kido et al. .................... 51/309 |
| 6,372,648 B1 | * 4/2002 | Hall et al. ................... 438/692 |
| 6,541,383 B1 | * 4/2003 | Allman et al. .............. 438/692 |

FOREIGN PATENT DOCUMENTS

| EP | 0 781 822 A | 7/1997 |
| EP | 0 896 042 A | 2/1999 |

* cited by examiner

*Primary Examiner*—David Nelms
*Assistant Examiner*—Quoc Hoang

(57) ABSTRACT

Polishing compositions comprising at least one soluble silane compound and at least one abrasive that are useful for polishing substrate surface features.

26 Claims, No Drawings

SILANE CONTAINING POLISHING COMPOSITION FOR CMP

BACKGROUND OF THE INVENTION

This invention concerns chemical mechanical polishing compositions and slurries that are useful for polishing one or more features associated with a substrate. The polishing compositions of this invention include at least one silane composition that remains in solution as well as at least one abrasive. This invention also includes a method of applying a silane composition to an abrasive pad to form a silane modified abrasive pad. This invention also includes methods for using polishing compositions of this invention to polish substrate features.

DESCRIPTION OF THE ART

Integrated circuits are made up of millions of active devices formed in or on a silicon substrate. The active devices, which are initially isolated from one another, are interconnected to form functional circuits and components. The devices are interconnected through the use of multilevel interconnections. Interconnection structures normally have a first layer of metallization, an interconnection layer, a second level of metallization, and sometimes a third and subsequent level of metallization. Interlevel dielectrics such as doped and undoped silicon dioxide ($SiO_2$), or low-k dielectrics tantalum nitride are used to electrically isolate the different levels of metallization in a silicon substrate or well. The electrical connections between different interconnection levels are made through the use of metallized vias. U.S. Pat. No. 5,741,626, which is incorporated herein by reference, describes a method for preparing dielectric tantalum nitride layers.

In a similar manner, metal contacts are used to form electrical connections between interconnection levels and devices formed in a well. The metal vias and contacts may be filled with various metals and alloys including titanium (Ti), titanium nitride (TiN), tantalum (Ta), aluminum copper (Al—Cu), aluminum silicon (Al—Si), copper (Cu), tungsten (W), and combinations thereof. The metal vias and contacts generally employ an adhesion layer comprising compounds such as titanium nitride (TiN), titanium (Ti), tantalum (Ta), tantalum nitride (TaN) or combinations thereof to adhere the metal layer to the $SiO_2$ substrate. At the contact level, the adhesion layer acts as a diffusion barrier to prevent the filled metal and $SiO_2$ from reacting.

In many semiconductor manufacturing processes, metallized vias or contacts are formed by a blanket metal deposition followed by a chemical mechanical polish (CMP) step. In a typical process, via holes are etched through an interlevel dielectric (ILD) to interconnection lines or to a semiconductor substrate. Next, a thin adhesion layer such as tantalum nitride and/or tantalum is generally formed over the ILD and is directed into the etched via hole. Then, a metal film is blanket deposited over the adhesion layer and into the via hole. Deposition is continued until the via hole is filled with the blanket deposited metal. Finally, the excess metal is removed by chemical mechanical polishing, (CMP) to form substrate surface features known as metal vias. Processes for manufacturing and/or CMP of vias are disclosed in U.S. Pat. Nos. 4,671,851, 4,910,155 and 4,944,836.

In a typical chemical mechanical polishing process, a substrate is placed in direct contact with a rotating polishing pad. A carrier applies pressure against the backside of the substrate. During the polishing process, the pad and table are rotated while a downward force is maintained against the substrate back. A chemically reactive polishing composition is applied to the pad during polishing. The polishing composition may contain an abrasive to form what is typically referred to as a "slurry". Alternatively, the polishing pad can including abrasive. In either circumstance, the polishing composition initiates the polishing process by chemically reacting with the surface of the substrate feature being polished. The polishing process is facilitated by the rotational movement of the pad relative to the substrate all the while delivering polishing composition/slurry to the wafer/pad interface. Polishing is continued in this manner until the desired amount film on the feature is removed. Polishing composition formulation is an important factor in the CMP step. The polishing composition should be tailored to provide effective polishing to metal layers at desired polishing rates while minimizing surface imperfections, defects and corrosion and erosion. Furthermore, the polishing composition may be used to provide controlled polishing selectivities to other thin-film materials used in current integrated circuit technology such as titanium, titanium nitride, tantalum, tantalum nitride, and the like.

There are various mechanisms disclosed in the prior art by which substrate surface features can be polished with CMP. The compositions surface may be polished using a slurry in which a surface film is not formed in which case the process proceeds by mechanical removal of metal particles and their dissolution in the slurry. In such a mechanism, the chemical dissolution rate should be slow in order to avoid wet etching. A more preferred mechanism is, however, one where a thin abradable layer is continuously formed by reaction between the metal surface and one or more components in the slurry such as a complexing agent and/or a film forming layer. The thin abradable layer is then removed in a controlled manner by mechanical action. Once the mechanical polishing process has stopped a thin passive film remains on the surface and controls the wet etching process. Controlling the chemical mechanical polishing process is much easier when a CMP slurry polishes using this mechanism.

Current copper containing substrates that are polished using chemical mechanical polishing also use Ta and TaN adhesion layers. Ta and TaN are chemically very passive and mechanically very hard and thus difficult to remove by polishing. Thus, there remains a need for polishing compositions that are useful for polishing substrates including tantalum while having little detrimental effect on previously polished copper features.

SUMMARY OF THE INVENTION

It is an object of this invention to provide polishing compositions that are able to effectively polish surface features of a substrate such as an integrated circuit.

It is a further object of this invention to provide polishing compositions for integrated circuits that are able to polish surface features with acceptable defectivity.

In one embodiment, this invention includes chemical mechanical polishing solution comprising at least one silane compound in solution and at least one abrasive.

In another embodiment, this invention includes aqueous chemical mechanical polishing compositions comprising at least one abrasive and at least one soluble silane compound in solution wherein the soluble silane compound is present in the solution in an amount ranging from about 0.02 to about 5.0 wt %, wherein the silane compound in solution has the following formula

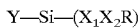

including dimers, trimers and oligomers thereof, wherein one substituent selected from R, $X_1$, $X_2$ and Y is selected from hydroxy or a hydrolyzable moiety and wherein three substituents selected from R, $X_1$, $X_2$ and Y are non-hydrolyzable moieties and wherein at least one of the non-hydrolyzable substituents is selected from the group consisting of alkyl or functionalized alkyl each having from 2 to 25 carbon atoms.

In still another embodiment, this invention includes a method for polishing a feature associated with a substrate surface. The method includes moving the substrate into contact with a polishing pad such that the substrate surface feature contacts the polishing pad. Next, the polishing pad is moved in relationship to the substrate surface. A polishing composition is applied to the polishing pad during polishing wherein the polishing composition is a solution comprising at least one silane compound in solution.

DESCRIPTION OF THE CURRENT EMBODIMENT

The present invention relates to chemical mechanical polishing compositions and to methods for using the compositions to polish a substrate surface feature.

Before describing the details of the various preferred embodiments of this invention, some of the terms that are used herein will be defined. The term "polishing composition" refers to a composition or solution that does not include abrasive materials. Polishing compositions can be combined with a polishing pad, with or without an abrasive, to polish substrates. Alternatively, polishing compositions can be combined with a particulate abrasive to form a polishing (CMP) "slurry." Polishing compositions and slurries are useful for polishing features associated with multiple level metallizations which may include but are not limited to semi-conductor thin-films, integrated circuit thin-films, and for any other films and surfaces where CMP processes are useful.

The term "substrate feature" as it is used herein refers to electronic substrate features such as vias and copper interconnect lines, and to layers of materials deposited on or in the features such as dielectric layers, low-k material layers, adhesion layers, metal layers, and so forth. The compositions of this invention are useful for both polishing substrates to remove material layers as well as for polishing exposed substrate features.

The polishing compositions and slurries of this invention include at least one silane compound in solution. General classes of silane compounds useful in polishing compositions of this invention include aminosilanes, uriedosilanes, alkoxysilanes, alkylsilanes, mercaptosilanes, thiocyanatosilanes, vinylsilanes, methacrylsilanes cyanosilanes, functionalized silanes such as functionalized alkyl silanes, disilanes, trisilanes and combinations thereof.

Preferred silane compositions have the formula:

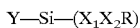

and include dimers, trimers and oligomers thereof wherein the term "oligomers" refers to a compound containing from 4 to 15 siloxane units. In the formulas above, Y, R, $X_1$, and $X_2$ may each be individually selected from hydroxy (—OH) or some other hydrolyzable substituent or from a non-hydrolyzable substituent. More preferably, in the formula above, Y is hydroxy (—OH) or a hydrolyzable substituent, $X_1$ and $X_2$ are each independently selected from hydroxy, a hydrolyzable substituent, or a non-hydrolyzable substituent, and R is a non-hydrolyzable substituent. In a preferred embodiment the silane composition will have the formula above wherein Y is hydroxy (—OH) or a hydrolyzable substituent, R is a non-hydrolyzable substituent; and $X_1$ and $X_2$ are each individually non-hydrolyzable substituents.

Generally, "hydrolyzable" substituents are those compounds that will form Si(OH) in an aqueous system. Such substituents include, but are not limited to alkoxide, halogens such as Cl, carboxylate, and amides. Non-hydrolyzable substituents are any compounds that do not undergo hydrolysis to form Si(OH) in an aqueous solution.

The non-hydrolyzable substituents are each independently selected from the group of substituent including alkyl, cycloalkyl, aromatic, functionalized alkyl, functionalized aromatic, functionalized cycloalkyl, alkene, alkylsilane, wherein each non-hydrolyzable substituent include from 1 to 100 carbon atoms and preferably 2 to 25 carbon atom and most preferably 2 to 10 carbon atom and wherein one or more of the carbon atoms may be substituted with one or more atoms selected from oxygen, nitrogen, sulfur, phosphorous, halogen, silicon, and combinations thereof.

Preferably, each non-hydrolyzable substituent is selected from the group of compounds consisting of alkyl, functionalized alkyl, and mixtures thereof having from 2 to 25 carbon atoms. More preferably each non-hydrolyzable substituent is a functionalized alkyl selected from the group consisting of alkylnitriles, alkylamides, alkylcarboxylic acids, alkyl halide, alcohol, alkyluriedo, and mixtures thereof. Most preferably, at least one of the non-hydrolyzable substituents is functionalized propyl alkyl.

When Y is a hydroxy or a hydrolyzable substituent, R is a non-hydrolyzable substituent and $X_1$ and $X_2$ are both hydroxy or a hydrolyzable substituent, then the silane compound is preferably selected from the group consisting of glycidoxypropyltrialkoxysilane, isocyanatopropyltrialkoxysilane, ureidopropyltrialkoxysilane, mercaptopropyltrialkoxysilane, cyanoethyltrialkoxysilane, 4,5-dihydro-1-(3-trialkoxysilylpropyl)imidazole, 3-(trialkoxysilyl)-methyl ester propenoic acid, trialkoxy[3-(oxiranylalkoxy)propyl]-silane, 2-methyl, 3-trialkoxysilyl) propyl ester 2-propenoic acid, [3-(trialkoxysilyl)propyl] urea, and mixtures hereof.

When Y is a hydroxy or a hydrolyzable substituent, R is a non-hydrolyzable substituent and one substituent selected from $X_1$ and $X_2$ is a non-hydrolyzable substituent then the silane is preferably selected from the group of silanes consisting of chloropropylmethyldialkoxysilane, 1,2-ethanediylbis[alkoxydimethyl] silane, dialkoxymethylphenyl silane, and mixtures thereof.

When Y is hydroxy or a hydrolyzable substituent and R, $X_1$ and $X_2$ are each non-hydrolyzable substituents then the silane is preferably selected from the group of silanes consisting of cyanopropyldimethylalkoxysilane, N,N'-(alkoxymethylsilylene)bis[N-methyl-benzamide], chloromethyldimethylalkoxysilane, and mixtures thereof.

For purposes of this invention, the term "alkoxy" where it appears in a silane compound name refers to the hydrolyzable group and may include —OR, Cl, Br, I, NRR' wherein R and R' may include from 1 to 20.

The compositions and slurries of this invention will typically include from about 0.01 to 5.0 wt % soluble silane. More preferably, the compositions of this invention will include from about 0.1 to about 1.0 wt % soluble silane. The term "soluble silane" as it is used herein refers to silanes that are present in the polishing compositions and slurries in a disassociated soluble or emulsified form.

The polishing compositions and slurries of this invention may comprise any solvents in which silanes can be dissolved or emulsified. Examples of useful solvents include polar solvents such as alcohols, and water. Water is the preferred solvent for the polishing compositions and slurries of this invention.

Silane compositions may be selected from those that adhere to abrasive particles in polishing slurries and in abrasive containing polishing pads, as well as from those silanes that adhere to the surface of the substrate feature being polished. When the present invention is polishing slurry including soluble silanes, then the silanes that are adhered to the abrasive particles are not considered to be "soluble" are not to be used in evaluating the amount of silane in the compositions of this invention.

It is preferred that the polishing compositions of this invention include at least about 0.02 wt % of silanes in solution when polishing is started. This means that, when the silane chosen adheres to abrasive particles in a polishing slurry or in a polishing pad, that the aqueous portion of the composition should still include at least 0.02 wt % of at least on silane compound in solution. Below the 0.02 wt % threshold, the silane in solution has tends to become ineffective in regulating substrate surface feature polishing.

The silanes useful in the polishing compositions and slurries of this invention are useful in improving substrate feature polishing results. Silanes can have one or more effects on substrate feature polishing. For example, silanes in a polishing composition or slurry can reduce polishing defects. Silanes can also improve the rates at which the substrate features can be polished and silanes can improve polishing selectivities. Silanes in solution can decrease the rates at which polishing compositions polish substrate features. And silanes in solution can improve the useful lifetime of abrasive containing polishing pads.

For purposes of this invention, the amount of soluble silane in a polishing solution or slurry is determined by separating the abrasive from the polishing slurry and thereafter determining the amount of silane in the abrasive free solution or by measuring the amount of silane in an abrasive-free polishing solution before the solution is applied to a polishing pad.

It is desirable to maintain the pH of the polishing compositions and slurries of this invention within a range of from about 2.0 to about 12.0, and preferably between from about 5.0 to about 9.0. The pH of the compositions an slurries of this invention can be adjusted using any known acid, base, or amine. However, the use of an acid or base that contains no metal ions, such as ammonium hydroxide and amines, or nitric, phosphoric, sulfuric, or organic acids are preferred to avoid introducing undesirable metal components into the CMP slurry of this invention.

The polishing compositions of this invention include one or more abrasives dispersed in the solution to form a chemical mechanical polishing (CMP) slurry. The polishing compositions of this invention may be abrasive free and be used alone or used in conjunction with an abrasive-containing polishing pad to polish features associated with a substrate.

The abrasive used in conjunction with polishing slurries and polishing pad will typically be selected from one or more metal oxide abrasives including but not limited to alumina, titania, zirconia, germania, silica, ceria and mixtures thereof. The polishing slurries of this invention preferably include from about 0.1 to about 15.0 weight percent or more of an abrasive. It is more preferred, however, that polishing slurries of this invention include from about 1.0 to about 6.0 weight percent abrasive when the slurry is used to polish metal features and from about 6 to about 15 wt % when the slurry is used to polish dielectric features.

The metal oxide abrasive may be produced by any techniques known to those skilled in the art such as sol-gel, hydrothermal or, plasma process, or by processes for manufacturing fumed or precipitated metal oxides. Preferably, the metal oxide is a fumed or precipitated abrasive and, more preferably it is a fumed abrasive such as fumed silica or fumed alumina with fumed silica being most preferred.

Other well known polishing slurry additives may be incorporated into the compositions and/or slurries of this invention. Examples of useful additives include one or more oxidizing agents such as hydrogen peroxide, ammonium persulfate, and the like; complexing agents, surfactants; inhibitors such as benzotriazole; organic acids and inorganic acids; and/or salts such as sulfuric acid, phosphoric acid, phosphonic acid, nitric acid, HF acid, ammonium fluoride, ammonium salts, potassium salts, sodium salts or other cationic salts of sulfates, phosphates, phosphonates, and fluorides, acids and bases used to adjust composition pH. Any ingredient that is known to be useful in chemical mechanical polishing slurries and compositions may be included in the polishing compositions and slurries of this invention.

The polishing compositions and slurries of this invention may be produced using conventional techniques known to those skilled in the art. Typically, the non-abrasive components, are mixed into an aqueous medium, such as deionized or distilled water, at pre-determined concentrations under low shear conditions until such components are completely dissolved or incorporated into the composition. A preferred polishing composition package of this invention will comprise an aqueous silane solution including an abrasive particle dispersion.

The polishing composition of this invention may be used to polish any type of substrate feature. It is preferred that the polishing compositions of this invention are used to polish metal features since the compositions of this invention exhibit desirable low defectivity towards metal layers such as copper layer, while exhibiting a desirable dielectric layer polishing rates. Examples of metals, oxides, and insulating materials that can be polished by the compositions of this invention include, but are not limited to, copper, copper alloys, tantalum, tantalum nitrate, tantalum alloys, tungsten, tungsten nitride, tungsten alloys, aluminum, aluminum alloys, titanium, titanium alloys, silica, doped glasses, inorganic polymers, as well as any combination thereof.

The polishing compositions and slurries of this invention may be used with any standard polishing equipment appropriate for use on the desired metal layer of the wafer. Polishing compositions of this invention are most useful for polishing substrates including either a tantalum or tantalum nitride feature and a copper alloy containing feature, both over a dielectric layer.

When used to polish a substrate including a metal feature, the polishing composition is applied to the substrate or a polishing pad and the substrate is polished by conventional means using conventional polishing machines. Once the polishing step is complete, the polishing composition is washed from the substrate with deionized water or another solvent and the substrate is ready for further processing.

The polishing slurries of this invention may be applied directly to the substrate, they may be applied to a polishing pad, or they may be applied to both in a controlled manner during substrate polishing. It is preferred however that polishing slurries are applied to a polishing pad which thereafter is brought into contact with the substrate surface after which the pad is moved in relationship to the substrate surface in order to polish substrate features. Polishing compositions and slurries of this invention may be continuously or intermittently applied to a polishing pad in order to maintain a sufficient amount of polishing composition or slurry at the pad/substrate surface.

Polishing compositions of this invention may be combined with at least one abrasive to give a chemical mechanical polishing slurry that is useful for polishing substrates. Alternatively, the polishing compositions of this invention can be used in conjunction with an abrasive containing pad or an abrasive free pad to polish metal layers, adhesion oxide layers and dielectric layers associated with substrates. Examples of abrasive pads that may be used with polishing compositions of this invention are disclosed in U.S. Pat. Nos. 5,849,051 and 5,849,052 the specification of which are incorporated herein by reference.

In one preferred method of this invention, abrasive free polishing compositions including soluble silanes are applied to a polishing pad including abrasive particles as generally described above and is then used to polish substrate surface features.

The polishing compositions may be used during the various stages of semiconductor integrated circuit manufacture to provide effective polishing at desired polishing rates while minimizing surface imperfections and defects.

EXAMPLE 1

This Example explores the ability of polishing slurries including various amounts of in solution to polish copper wafers. Each of the polishing compositions used was an aqueous solution including 3 wt % fumed aluminum, 0.7 wt % ammonium oxalate, and 2.5 wt % hydrogen peroxide. The pH of each slurry was adjusted to 7.7 using KOH. Each polishing slurry included varying types or amounts of silanes. Table 1 below indicates the amount and type of silane included in each polishing composition tested as well as the amount of silane detected in the solution before polishing. Table 1 below also summarizes copper polishing rates, TEOS polishing rates, and tantalum removal rates for each slurry tested.

Wafer polishing was performed using an Applied Materials Mirra polishing machine and a single step process with MP/IP/RRP/PS of 4/4.5/4/63/57. Polishing was performed with a Rodel IC1000 over Suba IV polishing pad.

also show that small amounts of silane solution improves copper removal rates without degrading within wafer nonuniformity, a measure of substrate planarization. The results of runs 2–6 show that silanes selected and incorporated into polishing compositions to increase dielectric layer polishing rates. And the results of runs 7–9 show that silanes can be incorporated into polishing compositions to reduce dielectric layer (oxide) polishing rates.

We claim:

1. A polishing slurry comprising at least one functionalized alkylsilane compound in solution and at least one abrasive.

2. A polishing slurry comprising at least one silane in solution and at least one abrasive wherein the silane has the following formula:

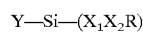

dimers, trimers and oligomers thereof, wherein $X_1$, $X_2$ and Y are each independently selected from, hydroxy, a hydrolyzable substituent and a non-hydrolyzable substituent and wherein R is a non-hydrolyzable substituent.

3. The polishing slurry of claim 2 wherein Y is hydroxy (—OH) or a hydrolyzable substituent, $X_1$ and $X_2$, are each independently selected from hydroxy, a hydrolyzable substituent, and a non-hydrolyzable substituent, and R is a non-hydrolyzable substituent wherein each of the non-hydrolyzable substituents are independently selected from the group consisting of alkyl, cyloalkyl, aromatic, functionalized alkyl, functionalized aromatic, functionalized cycloalkyl, alkenes, disilane, and trisilane, one or more of which carbon atoms may be substituted with one or more atoms selected from oxygen, nitrogen, sulfur, phosphorous, halogen and combinations thereof.

4. The polishing slurry of claim 2 wherein $X_1$ and $X_2$ are each selected from the group consisting of hydroxy or a hydrolyzable substituent.

5. The polishing slurry of claim 4 wherein R is selected from the group of compounds including alkyl and functionalized alkyl.

6. The polishing slurry of claim 4 wherein the silane compound is selected from the group consisting of glycidoxypropyltrialkoxysilane, isocyanatopropyltrialkoxysilane, ureidopropyltrialkoxysilane, mercaptopropyltrialkoxysilane, cyanoethyltrialkoxysilane, 4,5-dihydro-1-(3-trialkoxysilylpropyl)imidazole, 3-(trialkoxysilyl)-methyl ester propanoic acid, trialkoxy[3-(oxiranylalkoxy)propyl]-silane, 2-methyl, 3-(trialkoxysilyl) propyl ester 2-propenoic acid, [3-(trialkoxysilyl)propyl] urea, and mixtures thereof.

TABLE 1

| Run | Silane | Silane in solution | Cu Rate (Å/min) | Dia wiwnu | Ta Rate (Å/min) | TEOS Rate (Å/min) |
| --- | --- | --- | --- | --- | --- | --- |
| 1 | None | | 8392 | 5.6 | 255 | 11 |
| 2 | 0.25% 3-(diethoxymethylsilyl)propylamine | 0.248% | 8790 | 6.1 | 154 | 145 |
| 3 | 0.5 % 3(diethoxymethylsilyl)propylamine | 0.569% | 8855 | 7.8 | 101 | 95 |
| 4 | 1.25% 3-(diethoxymethylsilyl)propylamine | 1.413% | 9091 | 9.7 | 42 | 82 |
| 5 | 0.25% 3-[bis(2-hydroxyethyl)amino]propyltriethoxysilane | 0.165% | 8784 | 10.1 | 300 | 163 |
| 6 | 1.25% 3-[bis(2-hydroxyethyl)amino]propyltriethoxysilane | 0.867% | 8873 | 12.5 | 279 | 224 |
| 7 | 0.03% 3-Cyanoproplydimethylchlorosilane | 0.010% | 12021 | 13.2 | 213 | 13 |
| 8 | 0.08% 3-Cyanoproplydimethylchlorosilane | 0.015% | 10728 | 14.5 | 242 | 9 |
| 9 | 0.3% 3-Cyanoproplydimethylchlorosilane | 0.05% | 10842 | 14.4 | 240 | 7 |
| 10 | None | | 9493 | 19.7 | 212 | 47 |

The polishing results indicate that the copper removal rate increases with the presence of silane in solution. The results 7. The polishing slurry of claim 2 wherein one substituent selected from $X_1$ and $X_2$ is a non-hydrolyzable substituent.

8. The polishing slurry of claim 7 wherein at least one substituent selected from R and the non-hydrolyzable substituent selected from $X_1$ and $X_2$ are each independently selected from the group of compounds including alkyl, functionalized alkyl, and mixtures thereof.

9. The polishing slurry of claim 8 wherein the silane is selected from the group consisting of chloropropylmethyldialkoxysilane, 1,2-ethanediylbis[alkoxydimethyl] silane, dialkoxymethylphenyl silane, and mixtures thereof.

10. The polishing slurry of claim 2 wherein $X_1$ and $X_2$ are each non-hydrolyzable substituents.

11. The polishing slurry of claim 10 wherein R, $X_1$ and $X_2$ are each independently selected from the group of compounds including alkyl and functionalized alkyl.

12. The polishing slurry of claim 11 wherein the alkyl and functionalized alkyl have from 2 to 25 carbon atoms.

13. The polishing slurry of claim 12 wherein at least one of the non-hydrolyzable substituents is a functionalized alkyl selected from the group consisting of alkylnitriles, alkylamides, alkylcarboxylic acids, alkyl halide, alcohol, alkyluriedo, and mixtures thereof.

14. The polishing slurry of claim 13 wherein at least one of the non-hydrolyzable substituents is functionalized propyl alkyl.

15. The polishing slurry of claim 10 wherein the silane is selected from the group consisting of cyanopropyldimethylalkoxysilane, N,N'-(alkoxymethylsilylene)bis[N-methyl-benzamide], chloromethyldimethylalkoxysilane, and mixtures thereof.

16. The chemical mechanical polishing slurry of claim 2 wherein the silane is selected from the group consisting of glycidoxypropyltrialkoxysilane, isocyanatopropyltrialkoxysilane, ureidopropyltrialkoxysilane, mercaptopropyltrialkoxysilane, cyanoethyltrialkoxysilane, 4,5-dihydro-1-(3-trialkoxysilylpropyl)imidazole, 3-(trialkoxysilyl)-methyl ester propanoic acid, trialkoxy[3-(oxiranylalkoxy)propyl]-silane, 2-methyl, 3-(trialkoxysilyl) propyl ester 2-propenoic acid, [3-(trialkoxysilyl)propyl] urea, chloropropylmethyldialkoxysilane, 1,2-ethanediylbis[alkoxydimethyl] silane, dialkoxymethylphenyl silane, cyanopropyldimethylalkoxysilane, N,N'-(alkoxymethylsilylene)bis[N-methyl-benzamide], chloromethyldimethylalkoxysilane, and mixtures thereof.

17. The polishing slurry of claim 2 wherein the solution comprises at least one solvent selected from the group consisting of water, alcohols, and combinations thereof.

18. The polishing slurry of claim 2 wherein the solution is water.

19. The polishing slurry of claim 18 having a pH of from 2 to 11.

20. The polishing slurry of claim 18 having a pH of from 5 to 9.

21. The polishing slurry of claim 2 wherein the solution includes from about 0.02 to about 5.0 wt % silane.

22. The polishing slurry of claim 2 wherein the silane selected bonds to a substrate feature being polished.

23. The polishing slurry of claim 2 wherein the abrasive is a metal oxide abrasive.

24. The polishing slurry of claim 23 wherein the abrasive is selected from the group consisting of silica, alumina, germania, zirconia, ceria, and mixtures thereof.

25. The polishing slurry of claim 24 wherein the abrasive is selected from the group consisting of silica, alumina and combinations thereof.

26. An aqueous chemical mechanical polishing slurry comprising at least one abrasive and at least one soluble silane compound in solution wherein the soluble silane compound is present in the solution in an amount ranging from about 0.02 to about 5.0 wt % and wherein the silane compound has the formula:

$$Y—Si—(X_1X_2R)$$

dimers, trimers and oligomers thereof, wherein one substituent selected from R, $X_1$, $X_2$ and Y is selected from hydroxy or a hydrolyzable moiety and wherein three substituents selected from R, $X_1$, $X_2$ and Y are non-hydrolyzable moieties and wherein at least one non-hydrolyzable substituent is selected from alkyl or functionalized alkyl moieties each having from 2 to 25 carbon atoms.

* * * * *